US011943889B2

(12) United States Patent
Hsu

(10) Patent No.: US 11,943,889 B2
(45) Date of Patent: Mar. 26, 2024

(54) SERVER CASE AND SERVER HAVING SAME

(71) Applicant: Wiwynn Corporation, New Taipei (TW)

(72) Inventor: Shu-Ching Hsu, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 361 days.

(21) Appl. No.: 17/398,073

(22) Filed: Aug. 10, 2021

(65) Prior Publication Data
US 2022/0361355 A1 Nov. 10, 2022

(30) Foreign Application Priority Data
May 7, 2021 (TW) .................................. 110116657

(51) Int. Cl.
*H05K 7/14* (2006.01)
*H05K 7/18* (2006.01)

(52) U.S. Cl.
CPC ............ *H05K 7/1488* (2013.01); *H05K 7/18* (2013.01)

(58) Field of Classification Search
CPC .... H05K 7/1488; H05K 7/18; H05K 7/20145; H05K 7/20736; G11B 33/127; G06F 1/181; G06F 1/187; G06F 1/20
See application file for complete search history.

(56) References Cited

U.S. PATENT DOCUMENTS

| | | | | |
|---|---|---|---|---|
| 3,410,328 A | * | 11/1968 | Sasai | ........................ B65D 7/26 5/98.1 |
| 5,737,185 A | * | 4/1998 | Morrison | ................ G06F 1/184 360/99.07 |
| 9,070,419 B1 | * | 6/2015 | Zhu | ....................... G11B 33/128 |
| 9,367,082 B2 | * | 6/2016 | Jau | ............................. G06F 1/16 |
| 9,763,362 B1 | * | 9/2017 | Xu | ....................... G11B 33/142 |
| 10,299,401 B2 | * | 5/2019 | Chen | ....................... F16L 3/015 |
| 11,369,037 B1 | * | 6/2022 | Xu | ....................... G11B 33/142 |
| 2006/0120045 A1 | * | 6/2006 | Van Der Werff | .. H05K 7/20727 361/688 |

(Continued)

FOREIGN PATENT DOCUMENTS

| | | | | |
|---|---|---|---|---|
| CN | 106852078 A | * | 6/2017 | ......... H05K 7/20136 |
| KR | 102176041 B1 | * | 11/2020 | ........... H05K 7/1488 |
| TW | I519236 B | | 1/2016 | |

OTHER PUBLICATIONS

Examination report dated Dec. 30, 2021, listed in related Taiwan patent application No. 110116657.

(Continued)

*Primary Examiner* — Hiwot E Tefera
(74) *Attorney, Agent, or Firm* — McClure, Qualey & Rodack, LLP

(57) ABSTRACT

A server case includes a case, a drawer body, and a adjustable device. The drawer body is received in the case. The adjustable device includes a first end, a second end, and a adjustable structure. The second end is connected to the drawer body, the adjustable structure is connected to the first end and the second end, and a distance between the first end and the second end is changeable. The drawer body received in the case is moved until at least a part of the drawer body is located outside the case, to change the distance between the first end and the second end.

16 Claims, 7 Drawing Sheets

(56) References Cited

U.S. PATENT DOCUMENTS

| | | | | |
|---|---|---|---|---|
| 2010/0110634 A1* | 5/2010 | Woodbury, II | ....... | B62B 5/0026 361/679.01 |
| 2010/0123377 A1* | 5/2010 | Hsu | ...................... | H05K 7/1491 312/330.1 |
| 2012/0113582 A1* | 5/2012 | Hirano | ...................... | G06F 1/20 312/319.1 |
| 2013/0083480 A1* | 4/2013 | Tang | ......................... | G06F 1/20 416/246 |
| 2013/0342990 A1* | 12/2013 | Jau | ............................ | G06F 1/18 361/679.39 |
| 2014/0204537 A1* | 7/2014 | Rust | ........................ | H05K 7/02 361/727 |
| 2014/0293523 A1* | 10/2014 | Jau | ....................... | H05K 7/1487 361/679.4 |
| 2015/0201522 A1* | 7/2015 | Jau | ...................... | H05K 5/0217 312/330.1 |
| 2015/0243140 A1* | 8/2015 | Barrett | .................... | G06F 1/182 340/815.4 |
| 2016/0081228 A1* | 3/2016 | Lin | .................... | H05K 7/20736 361/679.48 |
| 2017/0205857 A1* | 7/2017 | Moore | .................. | A47B 88/49 |
| 2017/0212559 A1* | 7/2017 | Lai | .......................... | G06F 1/187 |
| 2018/0364772 A1* | 12/2018 | Liu | .................... | G01L 5/0028 |
| 2019/0280407 A1* | 9/2019 | Liu | .................... | H01R 12/7076 |
| 2021/0131450 A1* | 5/2021 | Yang | .................... | F04D 19/002 |
| 2022/0183180 A1* | 6/2022 | LaTorre | ............. | H05K 7/20736 |
| 2022/0346282 A1* | 10/2022 | Chen | .................. | H05K 7/20272 |

OTHER PUBLICATIONS

Office Action issued by TIPO in a related application. In that office action, TIPO rejected claims 1, 7-11 (which are generally relevant to claims 1, 7-11 of the present application), based on teachings from a cited reference TWI519236.

* cited by examiner

SERVER CASE AND SERVER HAVING SAME

CROSS-REFERENCE TO RELATED APPLICATION

This non-provisional application claims priority under 35 U.S.C. § 119(a) to Patent Application No. 110116657 filed in Taiwan, R.O.C. on May 7, 2021, the entire contents of which are hereby incorporated by reference.

BACKGROUND

Technical Field

The present disclosure relates to a server case, and in particular, a server case having a adjustable device and a server having a adjustable device.

Related Art

Nowadays, with the advance of technologies, the storage capacity of hard disks are becoming larger, and hard disks are becoming more sensitive to external influence sources. For example, the read performance of hard disks may be degraded by vibration sources such as an acoustic wave. However, server cases require more hard disks to be received in a system. When most of space in the system is used for deploying hard disks, the distance between fans and hard disks will become closer, and the hard disks will be influenced by the acoustic wave generated by high-speed rotation of the fan, resulting in degraded read performance of the hard disks.

SUMMARY

According to an embodiment, a server case includes a case, a drawer body, and a adjustable device. The drawer body is received in the case. The adjustable device includes a first end, a second end, and a adjustable structure. The second end is connected to the drawer body, the adjustable structure is connected to the first end and the second end, and a distance between the first end and the second end is changeable. The drawer body received in the case is moved until at least a part of the drawer body is located outside the case, to change the distance between the first end and the second end.

In some embodiments, the adjustable structure includes a adjustable rod component. The adjustable rod component is a pneumatic rod or is a adjustable rod and a spring. The adjustable device includes a first body and a second body. The first body is correspondingly located at the first end, and the second body is correspondingly located at the second end. The adjustable rod component is connected to the first body and the second body and provides an acting force to move the first body relative to the second body.

In some embodiments, the adjustable structure includes a adjustable sleeve, the adjustable sleeve includes a plurality of bending portions, and when at least a part of the drawer body is located outside the case, the plurality of bending portions are unfolded.

In some embodiments, the adjustable device further includes a limiting component. The limiting component has a continuous cross structure. The first body includes a first limiting hole and a first pivotal connection hole. The first limiting hole and the first pivotal connection hole are located on two opposite sides of the first body. The second body includes a second limiting hole and a second pivotal connection hole. The second limiting hole and the second pivotal connection hole are located on two opposite sides of the second body. The continuous cross structure includes two movable portions and two fixed portions. The two movable portions are respectively movably inserted to extend through the first limiting hole and the second limiting hole. The two fixed portions are respectively pivotally connected to the first pivotal connection hole and the second pivotal connection hole.

In some embodiments, the adjustable structure includes a slidable portion and a guide portion, the slidable portion is disposed on the first body, the guide portion is disposed on the second body, and the first body and the second body are slidably connected to each other by the slidable portion and the guide portion.

In some embodiments, the adjustable device further includes a driver, the driver is electrically connected to the adjustable rod component, the case further includes a sensor, the sensor is in signal connection with the driver, and when the sensor detects a signal and transmits the signal to the driver, the driver drives the adjustable rod component to move, to cause the first body to move relative to the second body.

In some embodiments, the adjustable device further includes a receiving structure, the receiving structure is disposed between the first body and the second body, and when the first body moves relative to the second body, a shape of the receiving structure changes accordingly.

In some embodiments, the receiving structure is a plurality of housings or hoses, where the plurality of housings are pivotally connected to each other.

In some embodiments, the adjustable device further includes a roller, and the roller is disposed at the adjustable device.

In some embodiments, the server case further includes a fan frame, where the fan frame is disposed at the first end of the adjustable device.

In some embodiments, the adjustable device further includes a stopper, the stopper is disposed at the first end, the case includes an opening portion, and when the first end of the adjustable device passes through the opening portion, the stopper presses against a wall of the case close to the opening portion.

In addition, another embodiment provides a server, including a case, a drawer body, a adjustable device, a hard disk device, and a fan module. The drawer body is received in the case. The adjustable device includes a first end, a second end, and a adjustable structure. The second end is connected to the drawer body, the adjustable structure is connected to the first end and the second end, and a distance between the first end and the second end is changeable. The hard disk device is assembled in the drawer body. A fan module is disposed at the first end of the adjustable device. The drawer body received in the case is moved until at least a part of the drawer body is located outside the case, to change the distance between the first end and the second end.

Based on the above, according to the foregoing embodiments, in the server case, the hard disk device can be assembled in the drawer body, and the drawer body is received in the case. The hard disk device in the server case needs to be pulled out the drawer body for replacement. However, during the repair and the replacement of the hard disk device, the drawer body is moved out of the case, and because the drawer body is not completely sealed, the rotation speed of the fan is increased accordingly, in order to dissipate heat in the drawer body. In this case, read performance of hard disk devices close to the fan will be affected by a high-frequency acoustic wave generated by the high speed rotation of the fan. Because the drawer body is connected to the case by the adjustable device, the adjustable device is also pulled when the drawer body is pulled out, so that the adjustable device moves along with the drawer body, and the distance between the first end and the second end is changed by means of the adjustable structure, to increase the distance between the fan and the hard disk device. In this way, in limited space, the distance between the fan and the hard disk device can be increased by using the adjustable structure, thereby reducing the impact of the acoustic wave generated by the fan on the hard disk read performance.

DETAILED DESCRIPTION

Figure 1:
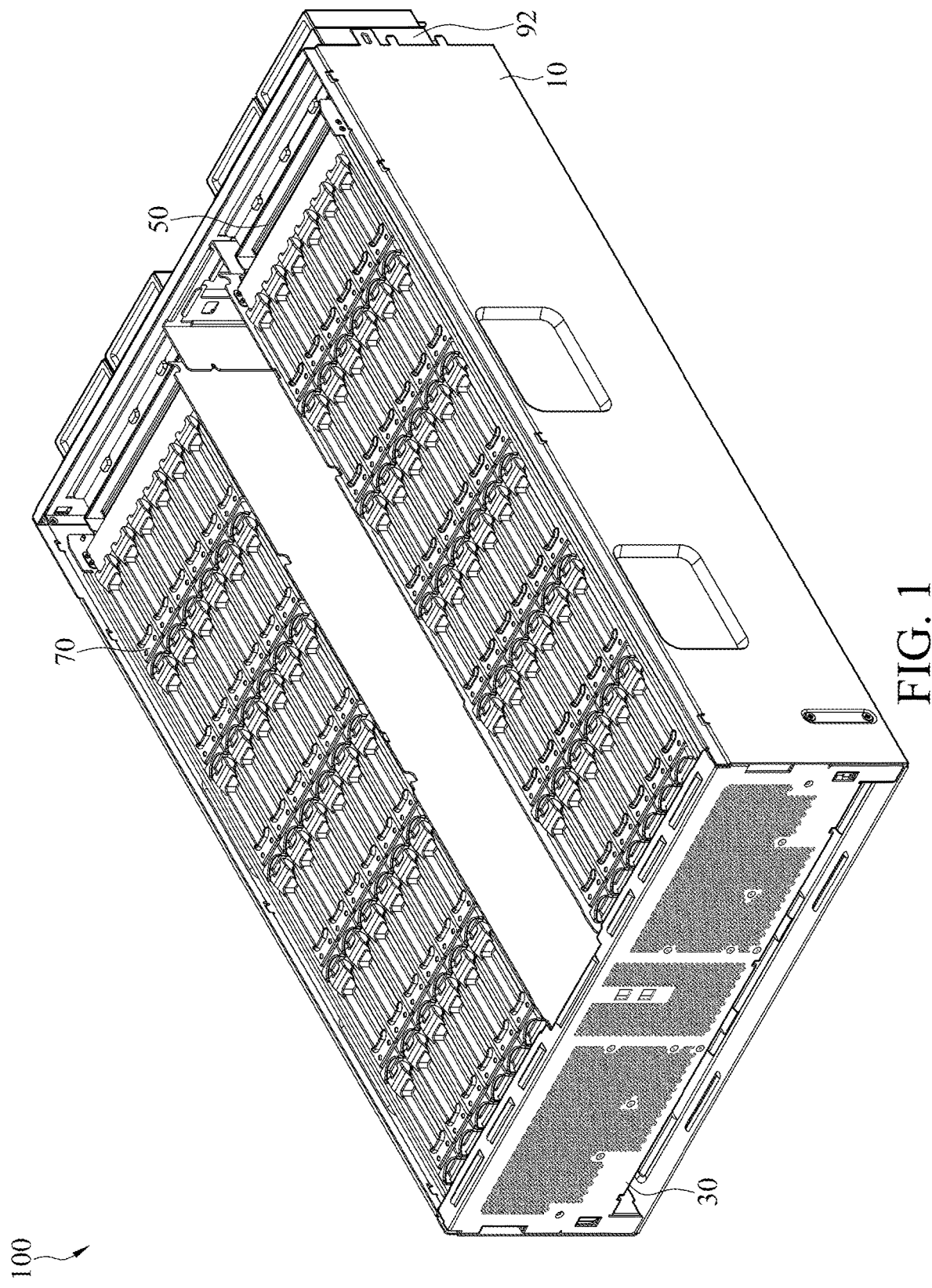
FIG. 1 is a three-dimensional diagram of a server case according to an embodiment.
Figure 2:
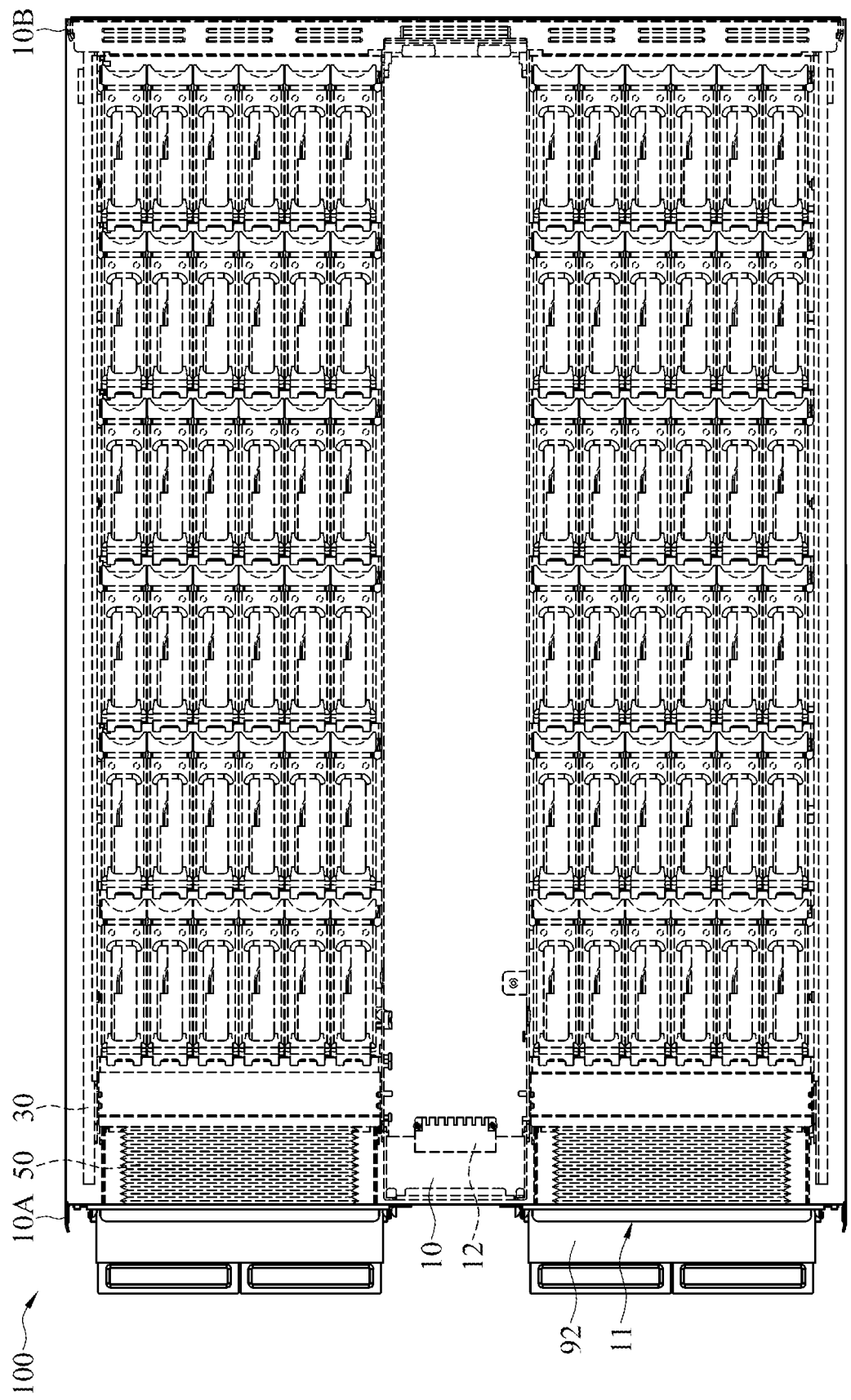
FIG. 2 is a diagram (I) showing a server case in use according to an embodiment.
Figure 3:
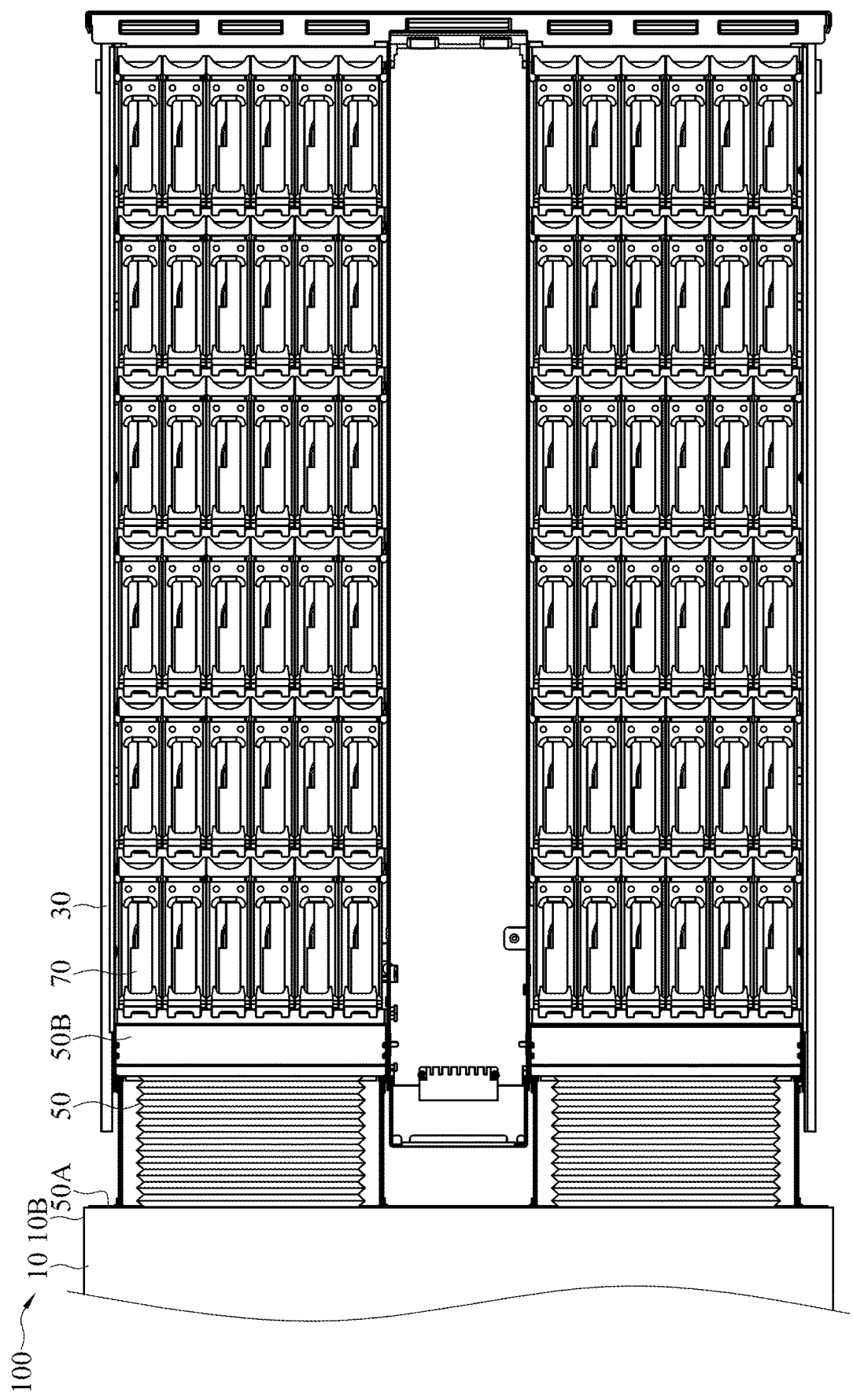
FIG. 3 is a diagram (II) showing a server case in use according to an embodiment.

Referring to FIG. 1, FIG. 2, and FIG. 3, an embodiment of the present disclosure discloses a server case 100, including a case 10, a drawer body 30, and a adjustable device 50.

In this embodiment, the case 10 is a rack server case, in which at least one rack server is received. The height of the rack server is measured in U (1 U equals to 1.75 inches, or equals to 44.45 millimeters). The case 10 receives, for example, but not limited to, rack servers of specifications ranging from 1 U to 7 U. In this embodiment, a hard disk device 70 is assembled in the drawer body 30. In this embodiment, the adjustable device 50 may be, for example, provided with a fan module 90. In this embodiment, as shown in FIG. 3, when the drawer body 30 is pulled out of the server case 100 having the adjustable device, the adjustable device 50 moves accordingly, and the distance between the fan module 90 and the hard disk device 70 is changed, to attenuate acoustic wave energy, reduce noise generated by an airflow from the fan module 90 on the hard disk device 70, and at the same time maintaining the heat dissipation effect of the server case. The fan module 90 may generate the airflow by suction or blowing. A suction fan module will be illustrated as an example in the following specification, but the present disclosure is not limited thereto.

The adjustable device 50 may be an independent kit. One or more adjustable device 50 may be configured to match cases 10 of different sizes, for example, but not limited to, server cases with different heights such as 1 U, 2 U, and 3 U, or server cases with different widths.

Refer to FIG. 1, FIG. 2, FIG. 3 and FIG. 4. As shown in FIG. 2 and FIG. 3, FIG. 2 shows the drawer body 30 received in the case 10, and FIG. 3 shows the drawer body 30 located outside the case 10. The hard disk device 70 is assembled in the drawer body 30. The drawer body 30 is received in the case 10. Specifically, the drawer body 30 can be selectively received in the case 10, or the drawer body 30 received in the case 10 can be pulled out of the case 10, so that at least a part of the drawer body 30 is detached from the case 10. The hard disk device 70 can be repaired or replaced by simply pulling the drawer body 30 out of the case 10. The adjustable device 50 includes a first end 50A and a second end 50B, the second end 50B is connected to the drawer body 30, and a distance between the first end 50A and the second end 50B is changeable. The drawer body 30 received in the case 10 is moved until at least a part of the drawer body is located outside the case, to change the distance between the first end 50A and the second end 50B of the adjustable device 50. Specifically, as shown in FIG. 2 and FIG. 3, the case 10 includes a receiving end 10A and an open end 10B, and when the drawer body 30 is received in the case 10, the first end 50A is close to the receiving end 10A of the case 10, or presses against the receiving end 10A of the case 10. When a part of the drawer body 30 is detached from the case 10, the first end 50A is far from the receiving end 10A of the case 10, and is close to or presses against the open end 10B of the case 10. Because the second end 50B of the adjustable device 50 is connected to the drawer body 30, the adjustable device 50 is driven to moved when the drawer body 30 is pulled out. The adjustable device 50 is located between the case 10 and the drawer body 30.

Figure 4:
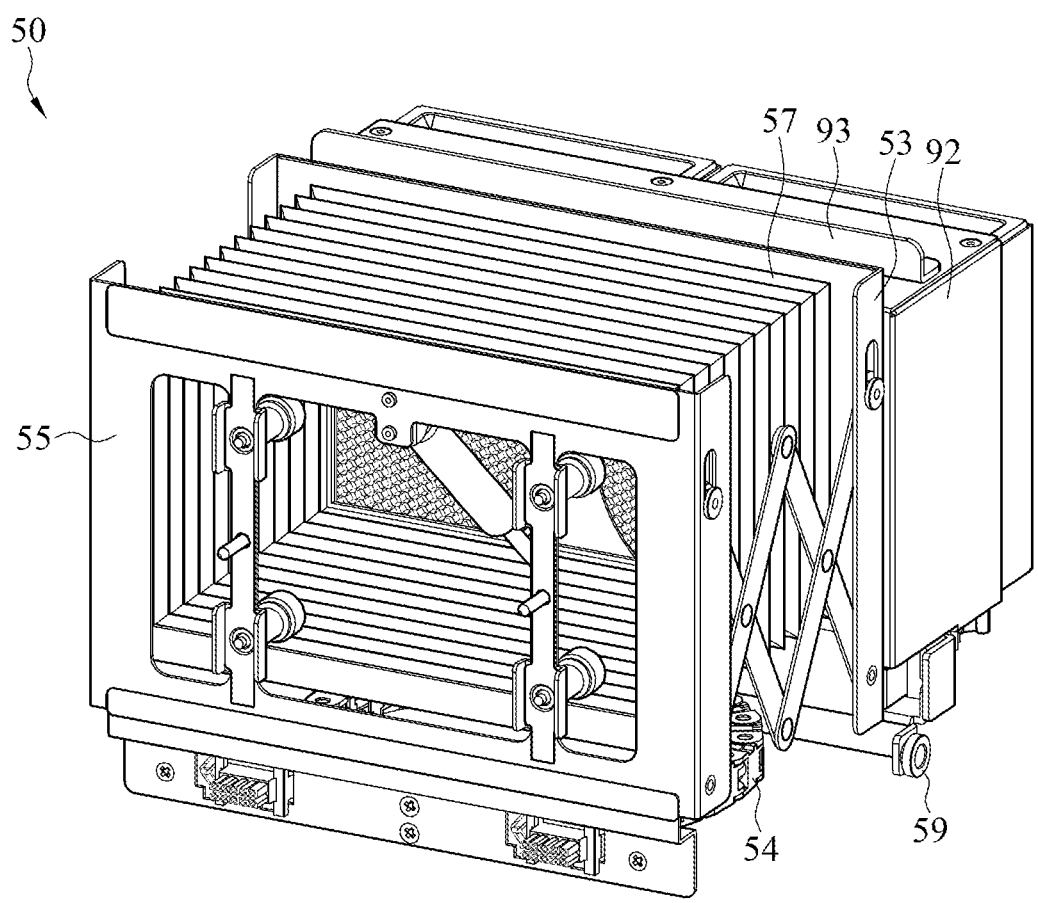
FIG. 4 is a three-dimensional diagram of a adjustable device according to an embodiment.
Figure 5:
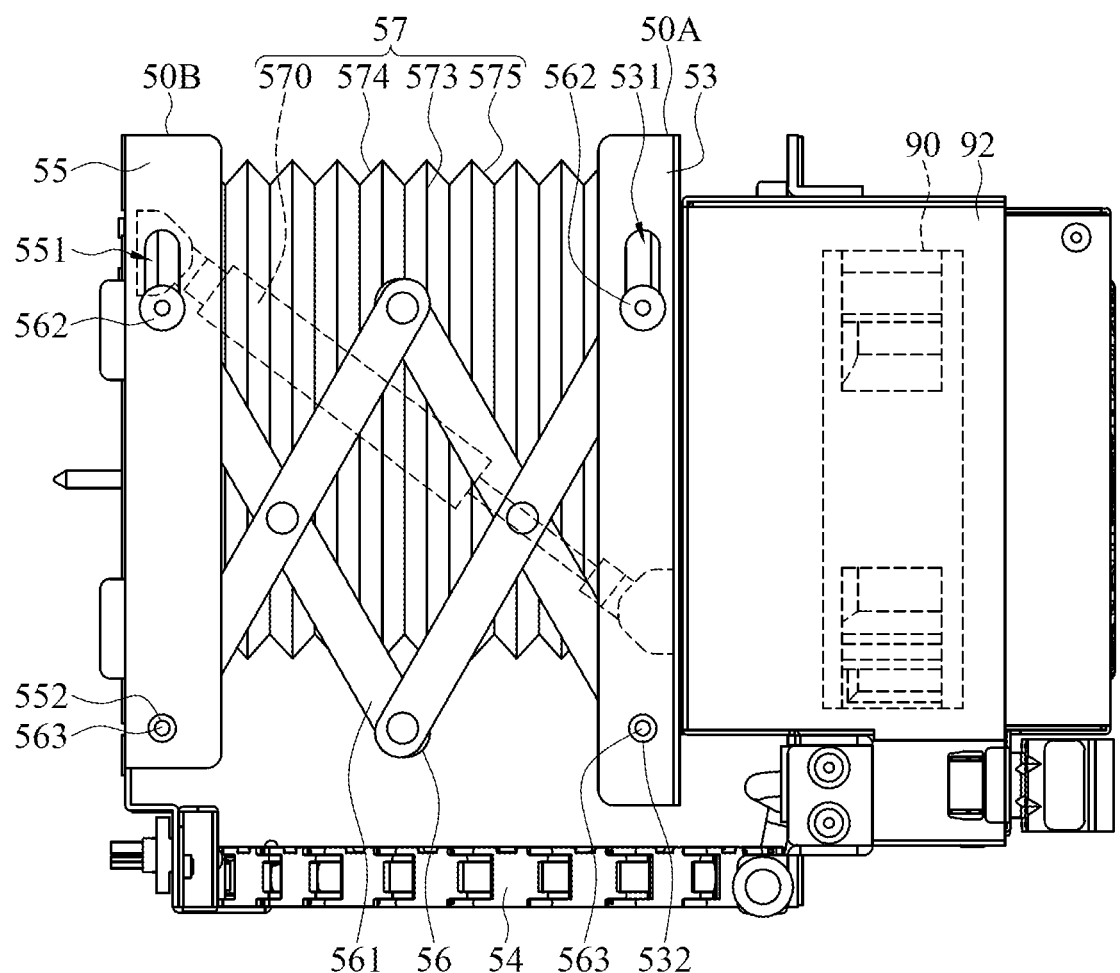
FIG. 5 is a side view of a adjustable device according to an embodiment.

As shown in FIG. 4 and FIG. 5, a adjustable structure 57 is connected to the first end 50A and the second end 50B, and the distance between the first end 50A and the second end 50B is changeable. Specifically, the first end 50A can be moved relative to the second end 50B, to change the distance between the first end 50A and the second end 50B. In this embodiment, the server case 100 further includes a fan frame 92. The fan frame 92 is disposed at the first end 50A of the adjustable device 50, and the fan module 90 is supported by the fan frame 92. In this embodiment, the adjustable device 50 further includes a roller 59. The roller 59 is disposed on the fan frame 92, but the present disclosure is not limited thereto. The adjustable device 50 can be moved in the case 10 by means of the roller 59. For example, referring to FIG. 3 and FIG. 4, when the drawer body 30 is detached from the case 10, the first end 50A of the adjustable device 50 is close to or presses against the open end 10B of the case 10, and due to an acting force provided by the adjustable structure 57, the first end 50A is far from the second end 50B. In this embodiment, the adjustable device 50 further includes a stopper 93. The stopper 93 is disposed at the first end 50A of the adjustable device 50. The case 10 includes an opening portion 11 located at the receiving end 10A. When the first end 50A passes through the opening portion 11, the stopper 93 presses against the receiving end 10A of the case 10, so that the first end 50A is close to the second end 50B. For example, the stopper 93 protrudes from the fan frame 92 at the first end 50A, and when the drawer body 30 presses back into the case 10, a part of the fan frame 92 passes through the opening portion 11 formed on the case 10, to cause the stopper 93 to press against the receiving end 10A of the case 10. The stopper 93 is influenced by the pressing force from the receiving end 10A and the force that pushes the drawer body back into the case 10, so that the first end 50A approaches the second end 50B due to the adjustable structure 57.

Specifically, in the server case 100, the hard disk device 70 can be assembled in the drawer body 30, and the drawer body 30 is received in the case 10. The second end 50B of the adjustable device 50 is connected to the drawer body 30, and the distance between the first end 50A and the second end 50B is changeable. The drawer body 30 can be selectively received in the case 10, or the drawer body 30 received in the case 10 can be pulled out of the case 10. When the drawer body 30 is pulled out, the unenclosed space weakens the airflow conveyance effect of the fan module 90, leading to a degraded heat dissipation effect. In this case, the rotation speed of the fan module 90 needs to be increased to maintain the heat dissipation effect. However, as the rotation speed of the fan module 90 increases, the vibration and noise generated increase accordingly, affecting the read performance of the hard disk device 70. Therefore, when the drawer body 30 is pulled out, the adjustable device 50 is also pulled, which moves along with the drawer body 30, so that the adjustable structure 57 causes the first end 50A to move relative to the second end 50B, to increase the distance between the fan module 90 and the hard disk device 70. When the rotation speed of the fan module 90 increases, the vibration and noise can be reduced by increasing the distance between the fan module 90 and the hard disk device 70.

In this embodiment, the adjustable device 50 includes a first body 53 and a second body 55. The first body 53 is correspondingly located at the first end 50A, and the second body 55 is correspondingly located at the second end 50B. The adjustable structure 57 is connected to the first body 53 and the second body 55 and provides an acting force to change a distance between the first body 53 and the second body 55. As shown in FIG. 5, the adjustable structure 57 may cause the first body 53 to move relative to the second body 55 in various manners. As shown in FIG. 5, in this embodiment, the adjustable structure 57 includes a adjustable rod component 570. The adjustable rod component 570 is connected to the first body 53 and the second body 55 and provides an acting force to cause the first body 53 to move relative to the second body 55. For example, referring to FIG. 2 and FIG. 3, when the drawer body 30 is received in the case 10, the drawer body 30 presses against the open end 10B of the case 10, so that the drawer body 30 is squeezed, and the adjustable rod component 570 contracts, so that the first body 53 and the second body 55 approach each other. When the drawer body 30 is pulled out of the case 10 by an external force, the pressing force exerted by the open end 10B of the case 10 on the drawer body 30 is released, and the adjustable rod component 570 provides the acting force to cause the first body 53 to move away from the second body 55.

As shown in FIG. 5, in this embodiment, the adjustable rod component 570 is a pneumatic rod, which is connected to the first body 53 and the second body 55. As shown in FIG. 4, due to limited space in the case 10, the pneumatic rod is diagonally connected to the first body 53 and the second body 55 to take up as small space as possible, but the present disclosure is not limited thereto. Provided that the case 10 has enough space, the pneumatic rod may also be horizontally connected to the first body 53 and the second body 55. In this embodiment, the pneumatic rod continuously provides a thrust to push the first body 53 away from the second body 55. When the drawer body 30 is received in the case 10, the drawer body 30 is squeezed, and the pneumatic rod is contracted by the pressing force exerted by the open end 10B of the case 10 on the drawer body 30. When the drawer body 30 is pulled out of the case 10, the pneumatic rod, which is no longer limited by the pressing force, causes the first body 53 to move away from the second body 55.

Figure 6:
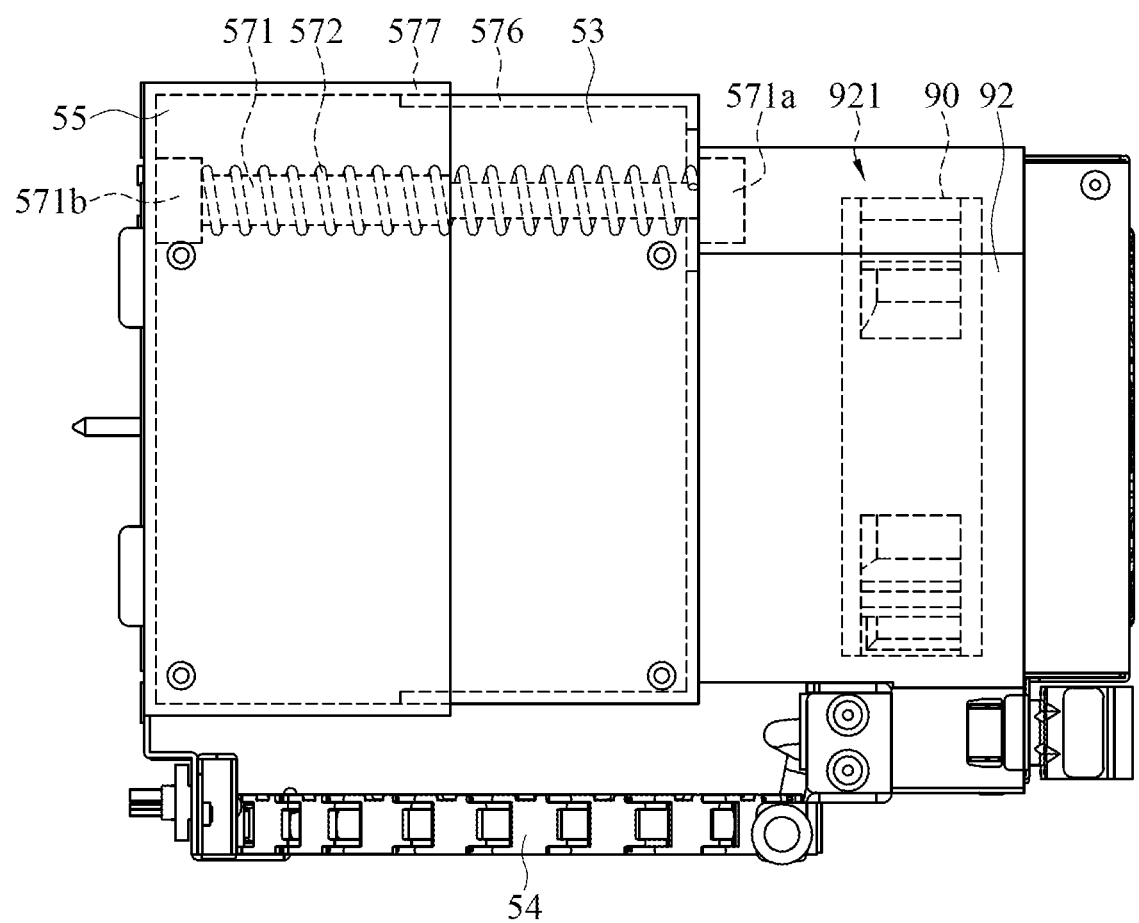
FIG. 6 is a side view of a adjustable device according to another embodiment.

As shown in FIG. 6, in another embodiment, the adjustable rod component 570 is a adjustable rod 571 and a spring 572, where the spring 572 is located between the first body 53 and the second body 55, and the adjustable rod 571 is inserted to extend through the spring 572. The adjustable rod 571 includes a first end 571a and a second end 571b. The second end 571b is connected to the second body 55, and the first end 571a is inserted to extend through the first body 53. In this another embodiment, the first end 571a of the adjustable rod 571 extends from the first body 53 to a shaft receiving space 921 of the fan frame 92. When the first body 53 is far from the second body 55, the first end 571a presses against the first body 53; when the first body 53 is close to the second body 55, the first end 571a presses against the fan frame 92. In this another embodiment, the telescoping rod 571 is inserted to extend through the spring 572, and the spring 572 continuously provides an elastic force to push the first body 53 away from the second body 55. When the drawer body 30 is received in the case 10, the drawer body 30 is squeezed, and the spring 572 is contracted by the pressing force exerted by the open end 10B of the case 10 on the drawer body 30. When the drawer body 30 is pulled out of the case 10, the spring 572, which is no longer limited by the pressing force, causes the first body 53 to move away from the second body 55.

Referring again to FIG. 5, in the embodiment shown in FIG. 5, the adjustable structure 57 includes a adjustable sleeve 573. The adjustable sleeve 573 connects the first body 53 at the first end 50A to the second body 55 at the second end 50B. The adjustable sleeve 573 includes a plurality of bending portions 575. When the first body 53 is far from the second body 55, that is, when at least a part of the drawer body 30 is located outside the case 10, the adjustable sleeve 573 is in an unfolded state, and the plurality of bending portions 575 are unfolded. When the first body 53 is close to the second body 55, that is, when the drawer body 30 is received in the case 10, the adjustable sleeve 573 is in a contracted state and the plurality of bending portions 575 are folded up. In this embodiment, because the drawer body 30 is not in a sealed state, the fan module 90 is driven to move away from the hard disk device 70 when the drawer body 30 is detached from the case 10. As a result, it is difficult for the airflow from the fan module 90 to reach the hard disk device 70. In order not to reduce the heat dissipation efficiency, the first body 53 and the second body 55 are connected by the adjustable sleeve 573. That is to say, the adjustable sleeve 573 is used to enclose the airflow from the first body 53 to the second body 55, to prevent leakage of the airflow. In this embodiment, when the distance between the first body 53 and the second body 55 is changed by the adjustable rod component 570, the adjustable sleeve 573 includes a plurality of bending portions 575, to enable the adjustable sleeve 573 to change its length with the adjustable rod component 570, so that the adjustable sleeve 573 can change between the unfolded state and the contracted state. When the first body 53 is far from the second body 55, that is, when the adjustable sleeve 573 is in the unfolded state, the bending portions 575 are unfolded to elongate the adjustable sleeve 573, and the bending portions 575 are unfolded to form an approximately V-shape. When the first body 53 is close to the second body 55, that is, when the adjustable sleeve 573 is in the contracted state, the bending portions 575 are bended to shorten the adjustable sleeve 573.

As shown in FIG. 5, the adjustable device 50 further includes a limiting component 56. The limiting component 56 has a continuous cross structure 561. The first body 53 includes a first limiting hole 531 and a first pivotal connection hole 532. The first limiting hole 531 and the first pivotal connection hole 532 are located on two opposite sides of the first body 53. The second body 55 includes a second limiting hole 551 and a second pivotal connection hole 552. The second limiting hole 551 and the second pivotal connection hole 552 are located on two opposite sides of the second body 55. The continuous cross structure 561 includes two movable portions 562 and two fixed portions 563. The two movable portions 562 are respectively movably inserted to extend through the first limiting hole 531 and the second limiting hole 551. The two fixed portions 563 are respectively pivotally connected to the first pivotal connection hole 532 and the second pivotal connection hole 552. When the first body 53 moves away from the second body 55, the two movable portions 562 move toward the two fixed portions 563, and the two movable portions 562 respectively press against one end of the first limiting hole 531 and one end of the second limiting hole 551. When the first body 53 moves toward the second body 55, the two movable portions 562 move away from the two fixed portions 563, and the two movable portions 562 respectively press against the other end of the first limiting hole 531 and the other end of the second limiting hole 551. A maximum elongation distance and a minimum contraction distance of the adjustable rod component 570 can be limited by the continuous cross structure 561.

Referring again to FIG. 6, in another embodiment, the adjustable structure 57 includes a slidable portion 576 and a guide portion 577, where the slidable portion 576 is disposed on the first body 53, the guide portion 577 is disposed on the second body 55, and the first body 53 and the second body 55 are slidably connected to each other by the slidable portion 576 and the guide portion 577. In this another embodiment, the slidable portion 576 is a slide rail, and the guide portion 577 is a slide block, but the present disclosure is not limited thereto. The slidable portion 576 may also be a slide block and the slide block 577 may also be a slide rail. In this another embodiment, the guide portion 577 on the second body 55 is engaged with the slidable portion 576 on the first body 53, so that the first body 53 and the second body 55 can slide relative to each other. In this another embodiment, the adjustable structure 57 is a combination of multiple cubes, and relative positions of the first body 53 and the second body 55 can be changed by the slidable portion 576 and the guide portion 577. To enclose the airflow generated by the fan module 90, the second body 55 wraps the first body 53 so that the airflow from the first body 53 to the second body 55 does not leak easily, thereby maintaining the heat dissipation effect of the fan module 90 for the hard disk device 70.

Referring again to FIG. 2 and FIG. 3, in the embodiments shown in FIG. 2 and FIG. 3, the adjustable device 50 further includes a driver, which is electrically connected to the adjustable rod component 570. The case 10 further includes a sensor 12. The sensor 12 is in signal connection with the driver. When the sensor 12 detects a signal and transmits the signal to the driver, the driver drives the adjustable rod component 570 to move, to cause the first body 53 to move relative to the second body 55. In this embodiment, the adjustable rod component 570 is an electrically-driven pneumatic rod, the elongation and shortening of which are controlled by signals. When the sensor 12 detects that the drawer body 30 is detaching from the case 10, the sensor 12 transmits a signal to the driver, and the driver drives the adjustable rod component 570 to cause the first body 53 to move away from the second body 55. When the sensor 12 detects that the drawer body 30 is being received in the case 10, the sensor 12 transmits a signal to the driver, and the driver drives the adjustable rod component 570 to cause the first body 53 to move toward the second body 55.

Figure 7:
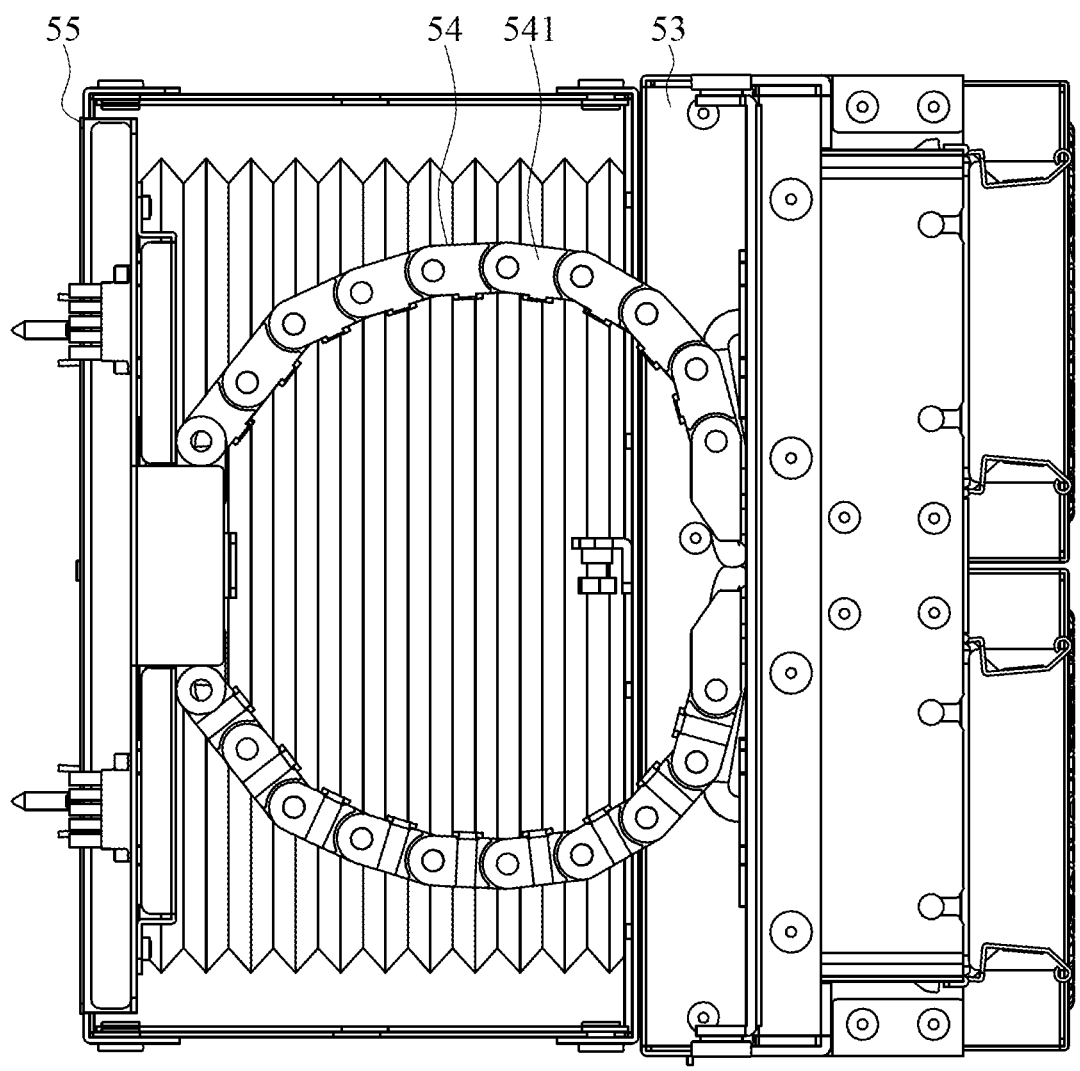
FIG. 7 is a bottom view of a adjustable device according to an embodiment.

Referring to FIG. 7, in this embodiment, the adjustable device 50 further includes a receiving structure 54. The receiving structure 54 is disposed between the first end 50A and the second end 50B. When the first end 50A moves relative to the second end 50B, a shape of the receiving structure 54 changes accordingly. In this embodiment, the receiving structure 54 can receive wires used in the adjustable device 50, such as a power cable and a signal cable. Specifically, when the first end 50A is moved away from the second end 50B, the receiving structure 54 is stretched and unfolded. When the first end 50A is moved toward the second end 50B, the receiving structure 54 is compressed and bent, and the wires are received in the receiving structure 54, so that the wires will not be messed up by the movement of the first end 50A relative to the second end 50B.

The receiving structure 54 may be implemented in various manners. In this embodiment, the receiving structure 54 may be a plurality of housings 541, where the plurality of housings 541 are pivotally connected to each other. In this embodiment, the housings 541 pivot relative to each other along with the movement of the first end 50A relative to the second end 50B. When the first end 50A is moved toward the second end 50B, the housings 541 pivoted relative to each other and form an approximately V-shape. When the first end 50A is moved away from the second end 50B, the housings 541 pivot relative to each other and form an approximately arch shape. In another embodiment, the receiving structure 54 is a hose. When the first end 50A is moved toward the second end 50B, the hose is bent into an approximately V-shape. When the first end 50A is moved away from the second end 50B, the hose is stretched to form an approximately arch shape.

Referring again to FIG. 1, FIG. 2, and FIG. 3, a server is provided according to an embodiment. The same structures in the server as those in the server case 100 will not be described herein again. The server includes a case 10, a drawer body 30, a adjustable device 50, a hard disk device 70, and a fan module 90. The drawer body 30 is received in the case 10. The adjustable device 50 includes a first end 50A, a second end 50B, and a adjustable structure 57. The second end 50B is connected to the drawer body 30, and the adjustable structure 57 is connected to the first end 50A and the second end 50B, so that a distance between the first end 50A and the second end 50B is changeable. The hard disk device 70 is assembled in the drawer body 30. The fan module 90 is disposed at the first end 50A of the adjustable device 50. The drawer body received in the case 10 is moved until at least a part of the drawer body is located outside the case 10, to change the distance between the first end 50A and the second end 50B of the adjustable device 50.

Based on the above, in the server case 100 provided by the present disclosure, the drawer body 30 is received in the case 10. The second end 50B of the adjustable device 50 is connected to the drawer body 30, and the distance between the first end 50A and the second end 50B is changeable. The drawer body 30 can be selectively received in the case 10, or the drawer body 30 received in the case 10 can be pulled out of the case 10. When the drawer body 30 is pulled out, the unenclosed space weakens the airflow conveyance effect of the fan module 90, leading to a degraded heat dissipation effect. In this case, the rotation speed of the fan module 90 needs to be increased to maintain the heat dissipation effect. However, as the rotation speed of the fan module 90 increases, the vibration and noise generated increase accordingly, affecting the read performance of the hard disk device 70. Therefore, when the drawer body 30 is pulled out, the adjustable device 50 is also pulled, which moves along with the drawer body 30, so that the adjustable structure 57 causes the first body 53 at the first end 50A to move relative to the second body 55 at the second end 50B, to increase the distance between the fan module 90 and the hard disk device 70. When the rotation speed of the fan module 90 increases, the vibration and noise can be reduced by increasing the distance between the fan module 90 and the hard disk device 70.

What is claimed is:

1. A server case, comprising:
a case;
a drawer body received in the case; and
an adjustable device comprising a first end, a second end, and an adjustable structure, wherein the second end is connected to the drawer body, the adjustable structure is connected to the first end and the second end, and a distance between the first end and the second end is changeable,
wherein the drawer body received in the case is moved until at least a part of the drawer body is located outside the case to change the distance between the first end and the second end;
wherein the adjustable device comprises an adjustable rod component, the adjustable rod component is a pneumatic rod or is an adjustable rod and a spring, the adjustable device comprises a first body and a second body, the first body is located at the first end, the second body is located at the second end, and the adjustable rod component is connected to the first body and the second body and the second body can move relative to the first body;
wherein the adjustable device further comprises a driver, the driver is electrically connected to the adjustable rod component, the case further comprises a sensor, the sensor is in signal connection with the driver, and when the sensor detects a signal and transmits the signal to the driver, the driver drives the adjustable rod component to move, to cause the first body to move relative to the second body.

2. The server case according to claim 1, wherein the adjustable structure comprises an adjustable sleeve, the adjustable sleeve comprises a plurality of bending portions.

3. The server case according to claim 2, wherein the adjustable device further comprises a limiting component, the limiting component has a continuous cross structure, the first body comprises a first limiting hole and a first pivotal connection hole, the first limiting hole and the first pivotal connection hole are located on two opposite sides of the first body, the second body comprises a second limiting hole and a second pivotal connection hole, the second limiting hole and the second pivotal connection hole are located on two opposite sides of the second body, the continuous cross structure comprises two movable portions and two fixed portions, the two movable portions are respectively movably inserted to extend through the first limiting hole and the second limiting hole, and the two fixed portions are respectively pivotally connected to the first pivotal connection hole and the second pivotal connection hole.

4. The server case according to claim 1, wherein the adjustable structure comprises a slidable portion and a guide portion, the slidable portion is disposed on the first body, the guide portion is disposed on the second body, and the first body and the second body are slidably connected to each other by the slidable portion and the guide portion.

5. The server case according to claim 1, wherein the adjustable device further comprises a receiving structure, the receiving structure is disposed between the first end and the second end, and when the first end moves relative to the second end, a shape of the receiving structure changes accordingly.

6. The server case according to claim 5, wherein the receiving structure is a plurality of housings or hoses, wherein the plurality of housings are pivotally connected to each other.

7. The server case according to claim 1, wherein the adjustable device further comprises a roller, and the roller is disposed at the adjustable device.

8. The server case according to claim 1, further comprising a fan frame, wherein the fan frame is disposed at the first end of the adjustable device.

9. The server case according to claim 1, wherein the adjustable device further comprises a stopper, the stopper is disposed at the first end, the case comprises an opening portion, and when the first end of the adjustable device passes through the opening portion, the stopper presses against a wall of the case close to the opening portion.

10. A server, comprising:
a case;
a drawer body, received in the case, wherein the drawer body is selectively received in the case or at least a part of the drawer body is located outside the case;
an adjustable device, having a first end, a second end, and an adjustable structure, wherein the second end is connected to the drawer body, the adjustable structure is connected to the first end and the second end, and a distance between the first end and the second end is changeable;
a hard disk device, assembled in the drawer body; and
a fan module disposed at the first end of the adjustable device;
wherein the drawer body received in the case is moved until at least a part of the drawer body is located outside the case, to change the distance between the first end and the second end;
wherein the adjustable structure comprises an adjustable rod component, the adjustable rod component is a pneumatic rod or is an adjustable rod and a spring, the adjustable device comprises a first body and a second body, the first body is located at the first end, the second body is located at the second end, and the adjustable rod component is connected to the first body and the second body and the first body can move relative to the second body;
wherein the adjustable device further comprises a driver, the driver is electrically connected to the adjustable rod component, the case further comprises a sensor, the sensor is in signal connection with the driver, and when the sensor detects a signal and transmits the signal to the driver, the driver drives the adjustable rod component to move, to cause the first body to move relative to the second body.

11. The server according to claim 10, wherein the adjustable structure comprises an adjustable sleeve, the adjustable sleeve comprises a plurality of bending portions.

12. The server according to claim 11, wherein the adjustable structure further comprises a limiting component, the limiting component has a continuous cross structure, the first body comprises a first limiting hole and a first pivotal connection hole, the first limiting hole and the first pivotal connection hole are located on two opposite sides of the first body, the second body comprises a second limiting hole and a second pivotal connection hole, the second limiting hole and the second pivotal connection hole are located on two opposite sides of the second body, the continuous cross structure comprises two movable portions and two fixed portions, the two movable portions are respectively movably inserted to extend through the first limiting hole and the second limiting hole, and the two fixed portions are respectively pivotally connected to the first pivotal connection hole and the second pivotal connection hole.

13. The server according to claim 10, wherein the adjustable structure comprises a slidable portion and a guide portion, the slidable portion is disposed on the first body, the guide portion is disposed on the second body, and the first body and the second body are slidably connected to each other by the slidable portion and the guide portion.

14. The server according to claim 10, wherein the adjustable device further comprises a receiving structure, the receiving structure is disposed between the first end and the second end, and when the first end moves relative to the second end, a shape of the receiving structure changes accordingly, wherein the receiving structure is a plurality of housings or hoses pivotally connected to each other.

15. The server according to claim 10, wherein the adjustable device further comprises a roller, and the roller is disposed at the adjustable device.

16. The server according to claim 10, wherein the adjustable device further comprises a stopper, and the stopper is disposed at the first end.

* * * * *